(12) United States Patent
Nakamura et al.

(10) Patent No.: US 8,956,459 B2
(45) Date of Patent: Feb. 17, 2015

(54) JOINED ASSEMBLY, WAFER HOLDING ASSEMBLY, ATTACHING STRUCTURE THEREOF AND METHOD FOR PROCESSING WAFER

(75) Inventors: Tsunehiko Nakamura, Kirishima (JP); Tatsuya Maehara, Kirishima (JP)

(73) Assignee: Kyocera Corporation, Kyoto (JP)

( * ) Notice: Subject to any disclaimer, the term of this patent is extended or adjusted under 35 U.S.C. 154(b) by 1898 days.

(21) Appl. No.: 11/816,814

(22) PCT Filed: Feb. 22, 2006

(86) PCT No.: PCT/JP2006/303150
§ 371 (c)(1),
(2), (4) Date: Nov. 21, 2008

(87) PCT Pub. No.: WO2006/090730
PCT Pub. Date: Aug. 31, 2006

(65) Prior Publication Data
US 2009/0130825 A1  May 21, 2009

(30) Foreign Application Priority Data

Feb. 23, 2005 (JP) .................................. 2005-047787

(51) Int. Cl.
*C23C 16/00* (2006.01)
*C23C 16/50* (2006.01)
(Continued)

(52) U.S. Cl.
CPC ...... *H01L 21/68735* (2013.01); *C23C 16/4586* (2013.01); *H01L 21/67103* (2013.01); *H01L 21/68785* (2013.01)
USPC ........................ 118/725; 118/728; 156/345.52

(58) Field of Classification Search
USPC .................. 118/715, 728; 156/345.51, 345.52
See application file for complete search history.

(56) References Cited

U.S. PATENT DOCUMENTS 5,753,891 A * 5/1998 Iwata et al. .................... 219/390
6,120,609 A * 9/2000 Selyutin et al. ................ 118/728
(Continued)

FOREIGN PATENT DOCUMENTS

JP  61-133187   8/1986
JP  09-262734  10/1997
(Continued)

OTHER PUBLICATIONS

Adachi, Sadao (2004). Handbook on Physical Properties of Semi-conductors, vol. 2. (pp: p. 88). Springer-Verlag. Online version available at: http://www.knovel.com/web/portal/browse/display?_EXT_KNOVEL_DISPLAY_bookid=1706&VerticalID=0, Accessed and Printed Jan. 11, 2011.*

(Continued)

*Primary Examiner* — Maureen Gramaglia
*Assistant Examiner* — Tiffany Nuckols
(74) *Attorney, Agent, or Firm* — Duane Morris LLP

(57) ABSTRACT

The object of the present invention is to provide an assembly, wafer holding assembly and attaching structure thereof, wherein sufficient air-tightness is assured during prolonged cycles of temperature rises and uninstallations and replacements of the assemblies are possible.

The joined assembly, according to the present invention, comprises a plate-shaped ceramic body; a ring-shaped member; and a hollow metal cylinder with one end thereof joined to the bottom surface of the plate-shaped ceramic body via a metal joint and the other end thereof joined to the ring-shaped member; wherein, the hollow metal cylinder having a shape to relax the stress caused by the differential thermal expansion between the plate-shaped ceramic body and the ring-shaped member.

19 Claims, 11 Drawing Sheets

(51) Int. Cl.
*C23F 1/00* (2006.01)
*H01L 21/306* (2006.01)
*H01L 21/687* (2006.01)
*C23C 16/458* (2006.01)
*H01L 21/67* (2006.01)

(56) References Cited

U.S. PATENT DOCUMENTS

| | | | |
|---|---|---|---|
| 6,239,402 B1 | 5/2001 | Araki et al. | 219/121.4 |
| 6,436,545 B1 | 8/2002 | Tanahashi et al. | 428/469 |
| 6,669,784 B2 * | 12/2003 | Futamura et al. | 118/729 |
| 2004/0149227 A1 * | 8/2004 | Saito et al. | 118/728 |
| 2004/0194710 A1 * | 10/2004 | Hanamachi et al. | 118/728 |

FOREIGN PATENT DOCUMENTS

| | | |
|---|---|---|
| JP | 10-032239 | 2/1998 |
| JP | 11-157951 | 6/1999 |
| JP | 2000-044345 | 2/2000 |
| JP | 2000-114355 | 4/2000 |
| JP | 2000-219578 | 8/2000 |
| JP | 2002-025913 | 1/2002 |
| JP | 2002-121083 | 4/2002 |
| JP | 2002-356382 | 12/2002 |

OTHER PUBLICATIONS

Haynes et al. Handbook of Chemistry and Physics, 91st Edition, 2011. (pp. p. 12-205). Accessed and printed on Jan. 11, 2011 from http://www.hbcpnetbase.com//articles/12_28_91.pdf#xml=http://www.hbcpnetbase.com/search/pdfHits.asp?id=12_28_91&DocId=117600&hitCount=11&hits=1479+1466+844+297+198+167+136+135+100+68+1+.*

* cited by examiner

US 8,956,459 B2

JOINED ASSEMBLY, WAFER HOLDING ASSEMBLY, ATTACHING STRUCTURE THEREOF AND METHOD FOR PROCESSING WAFER

FIELD OF THE INVENTION

The present invention relates to a joined assembly of a ceramic body joined with other materials such as metals, a wafer holding assembly using the joined assembly and the attaching structure thereof. The wafer holding assembly is used in thin film making apparatuses, such as for plasma enhanced CVD, low pressure CVD, optical CVD, and etching apparatuses, such as for optical etching.

BACKGROUND OF THE INVENTION

There are disclosed methods, for example as in Japanese Unexamined Patent Publication (Kokai) No. 11-157951, for joining sintered aluminum nitride bodies together, through a joining layer, by heating the aluminum nitride bodies at 1,800° C. to 2,000° C. Japanese Unexamined Patent Publication (Kokai) No. 2000-114355 discloses a heating apparatus using the sintered aluminum nitride bodies.

Joined assemblies, in which ceramic bodies are brazed together with other metallic bodies, have also been known. For example, Japanese Unexamined Patent Publication (Kokai) No. 2000-219578 and Japanese Unexamined Patent Publication (Kokai) No. 2002-121083 disclose a joined assembly 80 as shown in FIG. 12 and FIG. 13, wherein a plate-shaped ceramic body of sintered aluminum nitride 83 and a hollow metal cylinder 91 are joined together. In the joined assembly 80 shown in FIG. 13, there is disposed a ceramic sling 93, which is made of ceramics similar to the plate-shaped ceramic body 83, on the flange of the hollow metal cylinder 91 to relax the thermal stress and improve the durability of the joined assembly 80.

Japanese Unexamined Patent Publication (Kokai) No. 2002-25913 and Japanese Unexamined Patent Publication (Kokai) No. 10-32239 disclose a structure, wherein a plate shaped ceramic body is joined together with a metallic, or a metal/ceramic composite material.

In the joined assembly 80 shown in FIG. 11, which is disclosed in Japanese Unexamined Patent Publication (Kokai) No. 2000-44345, a plate-shaped ceramic body 83 is joined to a ring-shaped member 89 through the metallic spacer 70.

The joined assemblies shown in FIG. 11, FIG. 12 and FIG. 13 are related to wafer holding assemblies for vacuum chucking and/or heating of wafers in semiconductor manufacturing processes.

DISCLOSURE OF THE INVENTION

Problem to be Solved by the Invention

However, the conventional assemblies (wafer holding assemblies), as shown in FIG. 11 for example, suffer from problems that the joint portions are exfoliated, or cracked, during repeated cycles of temperature rises and falls, due to the differential thermal expansions between the plate-shaped ceramic body and the ring-shaped body, making it difficult to maintain sufficient air tightness.

In addition, when the wafer holding assemblies are welded directly to the chambers of film deposition apparatuses for example, the wafer holding assemblies cannot be removed from the chambers for cleaning, causing problems in that the cleaning of the holding assemblies becomes insufficient and/or changing to different types of wafer holding assemblies is impossible.

It is, therefore, the object of the present invention to provide a joined assembly, wafer holding assembly and attaching structure thereof, wherein sufficient air-tightness is assured even if high and low temperature are repeated alternately and uninstallations and replacements of the assemblies are possible.

Means for Solving Problem

In order to achieve the above described object, the joined assembly, according to the present invention, comprises a plate-shaped ceramic body; a ring-shaped member; and a hollow metal cylinder with one end joined to the bottom surface of the plate-shaped ceramic body via a metal joint and the other end joined to the ring-shaped member; wherein, the hollow metal cylinder is formed in a shape to relax the stress caused by the differential on thermal expansion between the plate-shaped ceramic body and the ring-shaped member.

In the joined assembly according to the present invention, it is preferably that the other end of the hollow metal cylinder is joined to the inner circular surface of the ring-shaped member.

Also, in the joined assembly of the present invention, it is preferably that the other end of the hollow metal cylinder comprises a turnback portion turned outside, wherein the cross section of the turnback portion is U-shaped.

Also, in the joined assembly of the present invention, it is preferably that the circumferential surface of the hollow metal cylinder has a corrugation.

The term "corrugated" and "corrugation" used herein are related to a shape, wherein ridge parts and depression parts are formed interchangeably, so that the outer circumference of the hollow metal cylinder appears corrugated.

The corrugation (ridge parts and depression parts) may be formed parallel to, or crossing with, the axis of the hollow metal cylinder.

When the corrugation is formed crossing with the axis of the hollow metal cylinder, it is preferable to form the corrugation perpendicular to the axis of the hollow metal cylinder.

In the joined assembly according to present invention, it is preferably that the hollow metal cylinder further comprises a flange portion at one end of the hollow metal cylinder, wherein one of the surfaces of the flange portion is joined to the plate-shaped ceramic body via the metal joint, and the other surface of the flange portion is joined to a stress relief member via a joint member, and wherein the differential on thermal expansion between the stress relief member and the plate-shaped ceramic body is $2 \times 10^{-6}$/° C. or less.

In the joined assembly according to the present invention, it is preferably that the plate-shaped ceramic body comprises a material selected from the group consisting of metal nitrides, metal carbides and alumina, as a main component and the hollow metal cylinder consists of a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

In the assembly according to the present invention, it is preferably that the ring-shaped member is made of a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

A wafer holding assembly according to the present invention is a joined assembly of the present invention, wherein the top surface of the plate-shaped ceramic body is a wafer mounting surface, and comprises an electrode for electrostatic chucking and/or a resistance heating element to heat the mounting surface.

An attaching structure of the wafer holding assembly, according to the present invention is an attaching structure wherein the bottom surface of the ring-shaped member is fixed to another member through at least one O-ring.

In the attaching structure of the wafer holding assembly, according to the present invention, wherein the wafer holding assembly may be fixed to other members, using bolts inserted through the through-holes formed in the ring-shaped member.

A method for processing wafers, according to the present invention, comprises a process of mounting a wafer on the wafer holding assembly according to the present invention, at least one process of depositing a semiconductor thin film, etching and forming a resist film while chucking using the chucking electrode and/or heating the wafer using the resistance heating element.

Effect of the Invention

According to the present invention, there is provided a joined assembly, or a wafer holding assembly, wherein no cracking occurs during cycles of heating to elevated temperatures and cooling, without causing any gas leakage during extended service times.

The present invention also provides a joined assembly, or a wafer holding assembly, wherein the assembly is easily installed on, or uninstalled from, the chambers of wafer processing apparatuses.

A large space, secured on the bottom surface of the plate-shaped ceramic body, allows a rapid heating of wafers and rapid cooling of the plate-shaped ceramic body.

The arrangement allows a quick change of the temperature setting of the wafer holding assembly and improves efficiency of the operation of the wafer holding assembly.

Therefore, the wafer holding assembly according to the present invention improves the utilizations of semiconductor manufacturing apparatuses, with its ease of installation, uninstallation and replacement.

EXPLANATION OF LETTERS

Figure 1A:
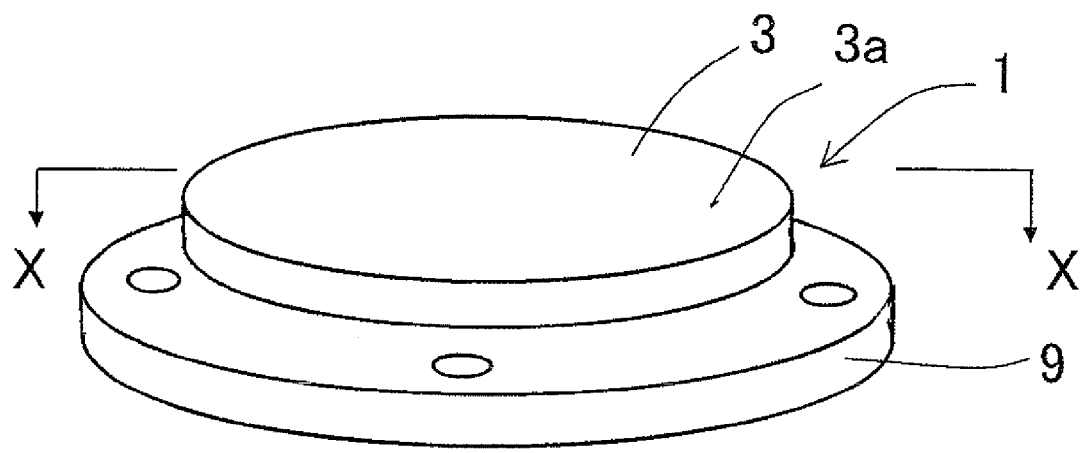
FIG. 1A is a perspective view showing a joined assembly according to the present invention.

1: Joined assembly
3: Plate-shaped ceramic body
3a: Mounting surface
5: Metal joint
7: Hollow metal cylinder
9: Ring-shaped member
9a: Through-hole for fixing
9b: Fixing surface
11: Electrostatic chucking electrode
13: Resistance heater
15: Stress relief member
15a: Groove
15b: Joint surface
17: Joint member
200: Vacuum chamber
22, 92: O-ring
23: Bolt
24: Cooling member
50: Joint member
70: Metallic spacer, Circular ring
80: Joined assembly
82: Resistance heater
83: Plate-shaped ceramic body
83a: Mounting surface
89: Ring-shaped ceramic member
94: Mounting base

BEST MODE FOR CARRYING OUT THE INVENTION

Now, the preferred embodiments of the present invention are explained in detail as follows with reference to appended drawings.

Figure 1B:
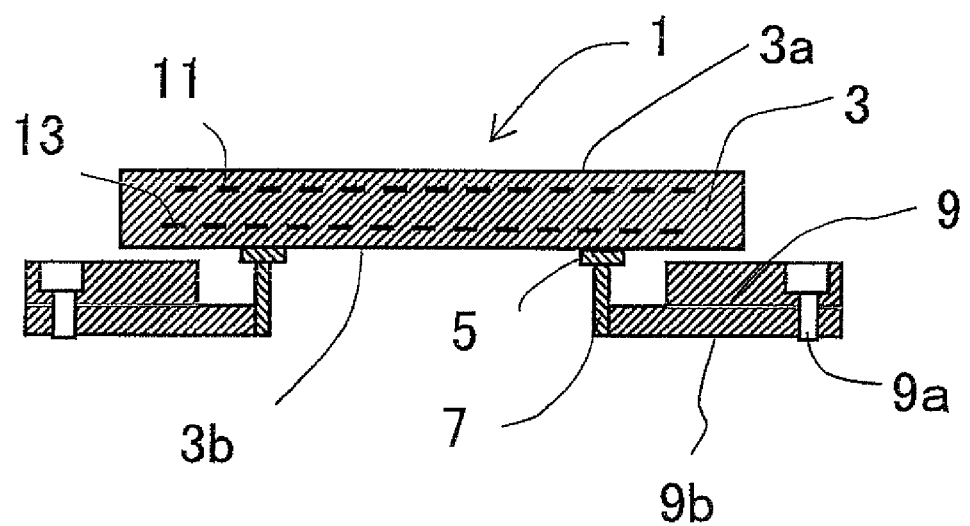
FIG. 1B is a cross sectional view taken along lines X-X of FIG. 1A.

FIG. 1A is a perspective view showing a joined assembly 1 and FIG. 1B is a cross sectional view taken along lines X-X in FIG. 1, according to an embodiment of the present invention. The joined assembly 1, according to this embodiment, comprises a plate-shaped ceramic body 3, a hollow metal cylinder 7 and a ring-shaped member 9; and is a wafer holding assembly of a semiconductor manufacturing apparatus with a mounting surface 3a on the top of the plate-shaped ceramic body 3. In the wafer holding assembly according to this embodiment, the bottom surface of the plate-shaped ceramic body 3 is joined to an end of the hollow metal cylinder 7, through a metal joint 5, while the other end of the hollow metal cylinder 7 is joined to the ring-shaped member 9.

It should be noted that one of the features of the present invention exists in the shapes of the members which are designed to relief stress caused by differences in coefficients of thermal expansion between the hollow metal cylinder 7 and the plate-shaped ceramic body 3, and between the hollow metal cylinder 7 and the ring-shaped member 9. In this embodiment, the hollow metal cylinder 7 is designed long enough comparing to the difference between the inner and outer diameters (hereinafter called "diameter difference") of the cylinder, so that the stress caused by the differential thermal expansions to the plate-shaped ceramic body 3 and the ring-shaped member 9 is relaxed.

In order to obtain the stress relief effect, the length of the hollow metal cylinder 7 should preferably be more than 10 times, more preferably be about 20 times, even more preferably be about 30 times the diameter difference.

In addition, an electrostatic chucking electrode 11 and/or a resistance heater 13 for heating the mounting surface 3a can also be embedded in the plate-shaped ceramic body 3.

Incidentally, the mounting surface 3a of the plate shaped ceramic body 3 is an interior surface of a vacuum chamber, while the bottom surface 3b surrounded by the hollow metal cylinder 7 is exposed to the atmosphere outside the vacuum chamber. Thus the joint between the plate-shaped ceramic body 3 and the hollow metal cylinder 7, and the joint between the hollow metal cylinder 7 and the ring-shaped member 9 are hermetically sealed for air tightness.

The wafer holding assembly according to this embodiment enables rapid cooling of the plate-shaped ceramic body 3, because the above arrangement allows a relatively large diameter (larger than half the diameter of the mounting surface 3a) of the circular area on the bottom surface 3b, surrounded by the hollow metal cylinder 7, so that a cooling member (not shown) can be made contact directly with the circular area on the bottom surface 3b.

In addition, as shown in FIG. 1B, the above arrangement enables a wafer to be chucked firmly on the mounting surface 3a by the electrostatic chucking electrode 11 embedded in the plate-shaped ceramic body 3 with voltage applied to the chucking electrode 11. Furthermore, the resistance heater 13, embedded in the plate-shaped ceramic body 3, enables the wafer mounted on the mounting surface 3a to be heated rapidly to a desired temperature. The above arrangement thus allows film deposition and etching processes on the wafer surface at a desired temperature.

As described above, the wafer holding assembly, according to the embodiment, is a joined assembly 1, comprising a plate-shaped ceramic body 3, a hollow metal cylinder 7 and a ring-shaped member 9, wherein one end of the hollow metal cylinder 7 is joined to the bottom surface of the plate-shaped ceramic body 3 via a metal joint 5 and the other end of the hollow metal cylinder 7 is joined to the ring-shaped member 9. In the joined assembly 1, the hollow metal cylinder 7 works as a cushion between the plate-shaped ceramic body 3 and the ring-shaped member 9 and prevents problems, such as cracking, from occurring in the joint interfaces, even if the coefficient of thermal expansion of the plate-shaped ceramic body 3 differs slightly from that of the hollow metal cylinder 7, and/or from that of the ring-shaped member 9. Especially, the cylindrical shape of the hollow metal cylinder 7 is effective in absorbing the differential thermal expansion between the hollow metal cylinder 7 and the plate-shaped ceramic body 3, even though their coefficients of thermal expansion differ in the temperature range of −100 to 600° C. As a result, the joined assembly is made insensitive to temperature variations. Preferably, the metal joint 5, joining the plate-shaped ceramic body 3 and the hollow metal cylinder 7, is made of a brazing material containing Ag and Cu. The brazing material containing Ag and Cu becomes soft enough to prevent stress concentration at the joint interfaces and, thus, prevents cracks and exfoliation from occurring at the joint interfaces during temperature changes.

When a metallic material is used for the ring-shaped member 9, the hollow metal cylinder 7 and the ring-shaped member 9 may be welded together. When a ceramic material is used for the ring-shaped member 9, another metal joint may be inserted for joining, as in the case of the joint between the plate-shaped ceramic body 3 and the hollow metal cylinder 7.

Preferably, the other end of the hollow metal cylinder 7 is joined to the inner circumferential surface of the ring-shaped member 9. The bottom surface of the ring-shaped member 9 should preferably be flat, since the surface is a mounting surface 9b used for mounting the joined assembly 1 to a semiconductor manufacturing apparatus and, for this reason, the end of the hollow metal cylinder 7 is joint to the inner circumferential surface of the ring-shaped member 9. Joining the ring-shaped member 9 and the hollow metal cylinder 7 in the aforementioned manner, stress due to differential thermal expansion is exerted in the thickness directions (or radial directions) of the hollow metal cylinder 7, making the joined assembly 1 less prone to the cracks and exfoliation due to temperature changes.

Figure 2:
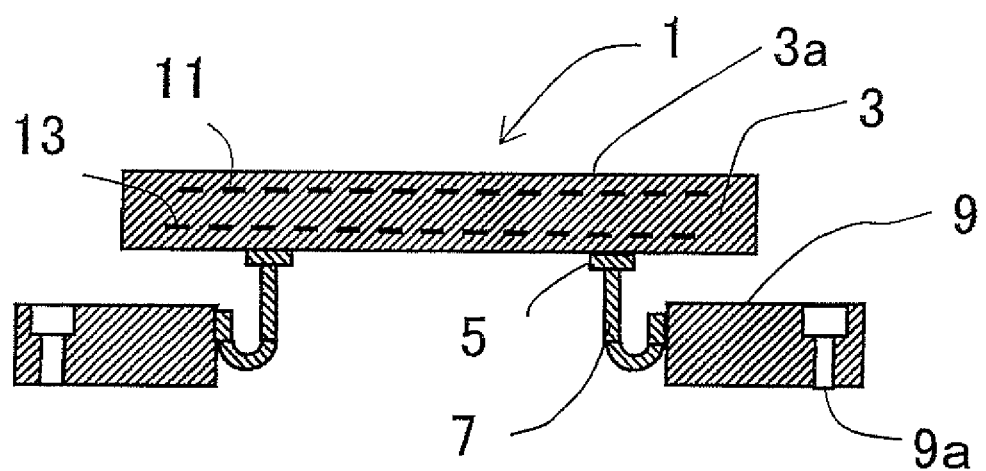
FIG. 2 is a cross sectional view showing a joined assembly according to the present invention.

In another embodiment, it is preferable to make the hollow metal cylinder 7 U-shaped in the vicinity of the joint with the ring-shaped member 9, as shown in FIG. 2. More specifically, in the embodiment shown in FIG. 2, the other end of the hollow metal cylinder 7 is turned outside in such a way that its cross section shows a U shape (U-shaped portion). The U-shaped portion absorbs the stress caused by the difference in coefficient of thermal expansion between the plate-shaped ceramic member 3 and the hollow metal cylinder 7. In addition, the stress relieving effect between the ring-shaped member 9 and the plate-shape ceramic body 3, which may have different coefficients of thermal expansion, is also enhanced, making the total stress relieved more effectively. By forming the U-shaped portion, the durability of the joined assembly 1 is significantly improved, even when the joined assembly 1 undergoes rapid thermal changes.

Figure 3:
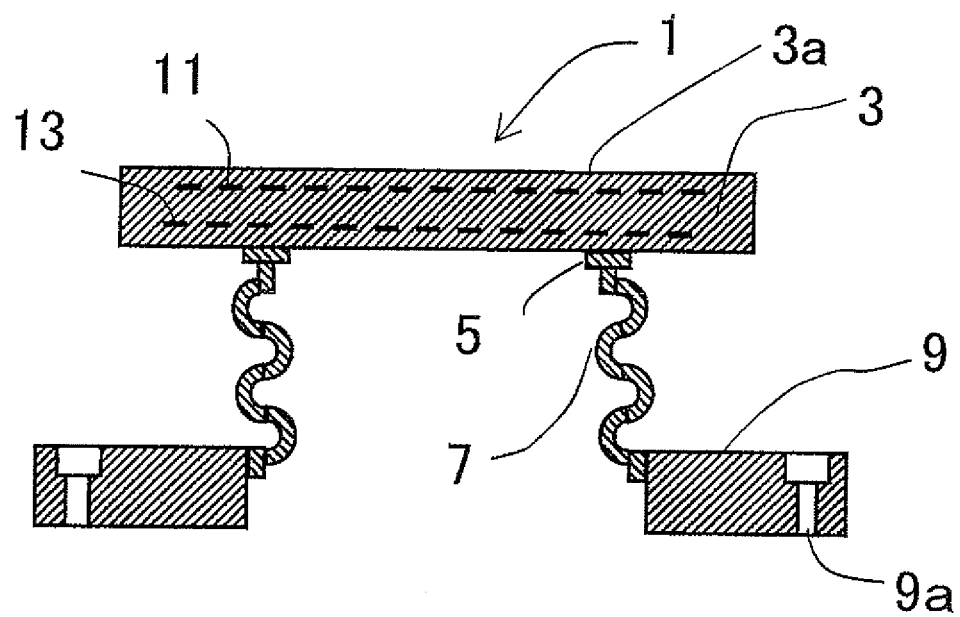
FIG. 3 is a cross sectional view showing a joined assembly according to the present invention.

Another embodiment of the present invention is shown FIG. 3. In this embodiment, the hollow-metal cylinder 7 is formed into a shape, in which ridge parts and depression parts are formed interchangeably around the cylinder. By making the hollow metal cylinder 7 corrugated (like a bellows), the stress, imposed on the metal joint 5 and the joint between the hollow metal cylinder 7 and the ring-shaped member 9, is relieved even more effectively, and the stress concentration caused by the differential thermal expansion between the plate-shaped ceramic body 3 and the hollow metal cylinder 7 can be avoided. As a result, there is provided the joined assembly 1 with a high reliability and much less prone to fracturing and cracking, even when the temperature of the joined assembly 1 is changed rapidly.

Figure 4:
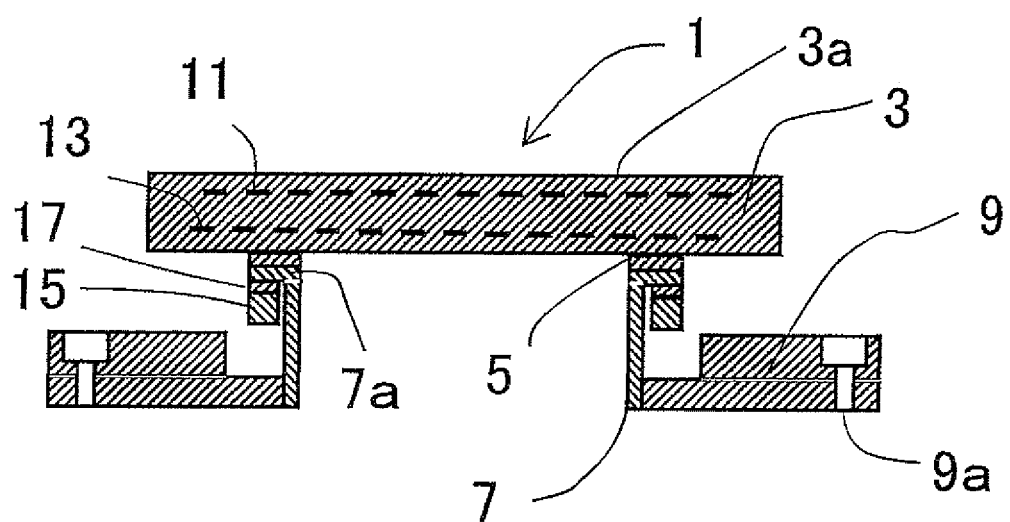
FIG. 4 is a cross sectional view showing a joined assembly according to the present invention.

Yet another embodiment of the present invention is shown FIG. 4. In this embodiment, a flange portion 7a is formed at one end of the hollow metal cylinder 7, and the flange portion 7a is joined to the plate-shaped ceramic body 3 via the metal joint 5. Preferably, a stress relief member 15, having a coefficient of thermal expansion, which is different from that of the plate-shaped ceramic body 3 by $2\times10^{-6}/°$ C. or less, is provided on the lower surface of the flange portion 7a via a metal joint member 17, whereas, the upper surface of the flange portion 7a is joined to the plate-shaped ceramic body 3 via the metal joint 5.

The stress relief member 15, having a coefficient of thermal expansion, which is different from that of the plate-shaped ceramic body 3 by $2\times10^{-6}/°$ C. or less, is joined to the lower surface of the flange portion 7a, so that the flange portion 7a is sandwiched between the plate-shaped ceramic body 3 and stress relief member 15. In this arrangement, the stress relief member 15 absorbs the expansion, or contraction, of the flange portion 7a due to the temperature change, preventing, for example, gaps from forming in the metal joint 5 made of brazing material and, thus, preventing gas leakage.

Figure 5:
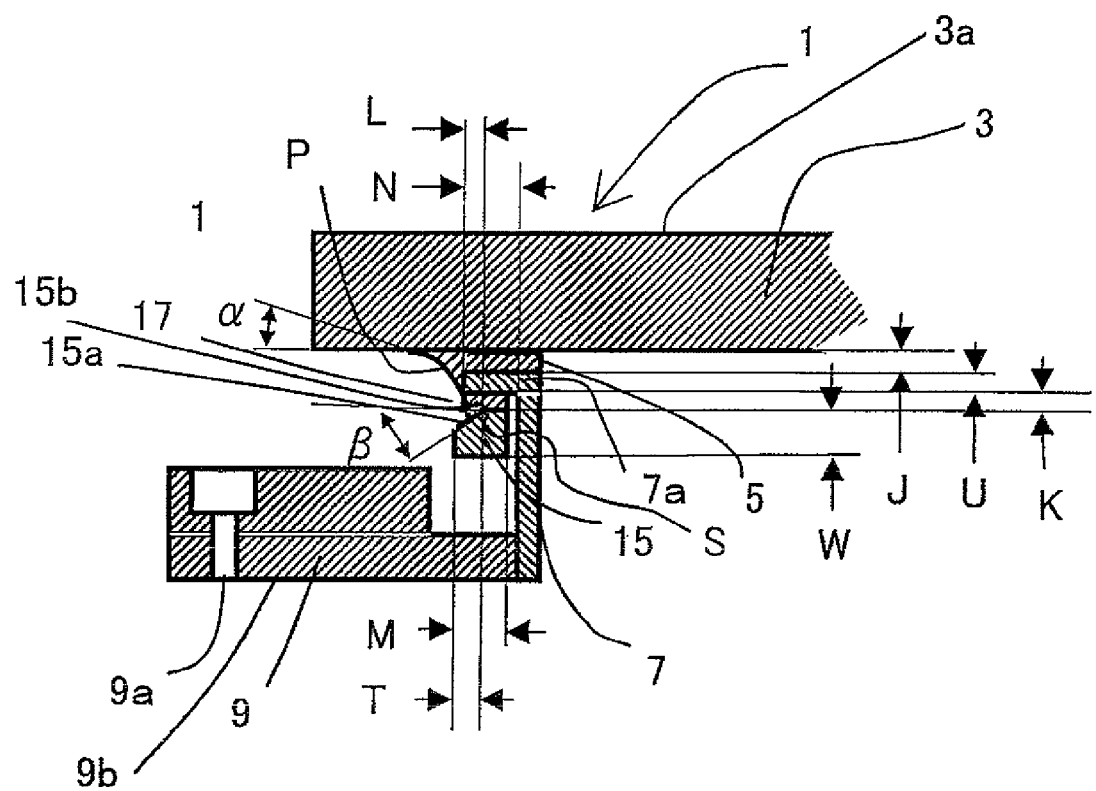
FIG. 5 is a cross sectional view showing a joined assembly according to the present invention.

In other words, as shown in FIG. 5 (a partial enlarged view of FIG. 4), the flange portion 7a of the hollow metal cylinder 7 is joined to the bottom surface of the plate-shaped ceramic body 3 via the brazing layer of the metal joint 5, and the opposing lower surface of the flange portion 7a is joined to the ring-shaped stress relief member 15. The structure prevents the deformation of the flange portion 7a during heat cycles even if there is a difference in the coefficient of thermal expansion between the plate-shaped ceramic body 3 and the flange portion 7a. This is because the flange portion 7a is confined in-between the plate-shaped ceramic body 3 and the stress relief member 15 which has a coefficient of thermal expansion equal to, or only slightly different from, that of the plate-shaped ceramic body 3. As a result, the metal joint 5 becomes even less prone to cracking and prevents gas leakage more effectively.

Furthermore, the thickness J of the metal joint 5, which joins the plate-shaped ceramic body 3 and the flange portion 7a, and the thickness K of the metal joint member 17, which joins the stress relief member 15 and the flange portion 7a of the hollow metal cylinder 7, are respectively made thick enough, in the range of 15 to 200 μm, to ensure the joint strength.

The shape and dimension of each member are preferably chosen in the following manner for this embodiment.

When the thicknesses J of the metal member 5 and K of the metal member 17 are chosen to be 15 μm or thicker, the width M of the stress relief member 15 is chosen to be narrower than the width of the flange portion 7a of the hollow metal cylinder 7. At the same time, a taper-shaped groove 15a is formed around the outer circumference of the stress relief member 15 in such a manner that the starting point S of the groove 15a is positioned virtually inside the flange portion 7a.

As a result, a smoothly concaved meniscus P is formed between the bottom surface of the plate-shaped ceramic body 3 and the groove 15a of the stress relief member 15, in which the brazing thicknesses J of metal member 5 and K of metal member 17, having thicknesses of 15 to 200 μm, flows out and are unified together. This prevents the accumulations of the brazing materials and breakage of the plate-shaped ceramic body 3 associated with the accumulations.

It should be noted that, even when a smoothly concaved meniscus P is formed between the bottom surface of the plate-shaped ceramic body 3 and the groove 15a of the stress relief member 15, stress may concentrate at the end of the meniscus P and may damage the plate-shaped ceramic body 3, when the angle α between the meniscus P and the plate-shaped ceramic body 3, exceeds 40°. Therefore, it is preferable to keep the angle α between the meniscus P and the plate-shaped ceramic body 3, at 400 or less, in order to effectively prevent the exfoliation of the metal joint 5 and/or breakage of the plate-shaped ceramic body 3. Incidentally, it is more preferable to maintain the angle α between the meniscus P and the plate-shaped ceramic body 3, at 30° or less. The angle α between the meniscus P and the plate-shaped ceramic body 3, is defined herein as the minimum of the angles formed by the radial lines, which approximate the curvatures of the meniscus P for a distance longer than 30% of the distance between the tip of the meniscus P and the circumference of the flange portion 7a, and the plate-shaped ceramic body 3.

The reason, for the thicknesses J of the metal joint 5 and K of the metal joint member 17 respectively to be preferably thicker than 15 μm, is that the thicknesses thinner than 15 μm results in tensile strengths lower than 180 MPa. It is more preferable to make the joints thicker than 30 μm. When the thicknesses J of the metal joint 5 and K of the metal joint member 17 exceed 200 μm, it will become difficult for the stress relief member 15 to prevent deformation of the flange portion 7a. More preferably, the thicknesses J of the metal joint 5 and K of the metal joint member 17 are kept at 100 μm, or less.

It is also preferable to select materials for the metal joint 5 and the metal joint member 17 with yield strengths of 196 MPa or higher. If the yield strengths of the metal joint 5 and the metal joint member 17 are lower than 196 MPa, the metal joint 5 and the metal joint member 17 may be damaged by the deformation of the flange portion 7a, making it difficult to prevent leakage. More preferably, the materials are chosen to have yield strengths higher than 250 MPa. However, if the yield stresses of the metal joint 5 and the metal joint member 17 exceed 980 MPa, stress concentration on the brazing materials may damage the plate-shaped ceramic body 3 and/or the stress relief member 15. Therefore, it is preferable that the yield strengths of the materials for the metal joint 5 and the metal joint member 17 are chosen within the range of 196 to 980 MPa and, more preferably, within the range of 250 to 780 MPa. Brazing materials, which do not melt at elevated operating temperatures, are preferably used for the metal joint 5 and the metal joint member 17. Preferred example includes a brazing material mainly comprising a metal selected from the group consisting of Ag, Au, Al, Cu, Pt, Pd, In and combinations thereof, and more preferably a brazing metal selected from the group consisting of Ag—Cu, Ti—Cu—Ag, Au—Ni and combinations thereof.

Any ceramic or metallic material may be used for the stress relief member 15, as far as the difference in coefficient of thermal expansion from that of the plate-shaped ceramic body 3 is $2\times10^{-6}/°$ C. or less. Preferably a ceramic material having the same composition as the plate-shaped ceramic body 3, and more preferably, the same ceramic material as used for the plate-shaped ceramic body 3, is used for the stress relief member 15.

It is also preferable that the thickness W of the stress relief member 15 is 1 mm or thicker. If the thickness W is less than 1 mm, the effect of preventing deformation of the flange portion 7a becomes insufficient. Preferable thickness W is 5 mm or more. Incidentally, there is no upper limit for the thickness W and any structurally allowable thickness may be applied.

In addition, the starting point S of the groove 15a is preferably positioned inside the outer circumference of the flange portion 7a when the stress relief member 15 is joined to the flange portion 7a, wherein the starting point S is defined as the cross point between a radial line on the joint surface 15b of the stress relief member 15 and a line on the tapered surface of the groove 15a. Furthermore, it is preferable to make the distance L, which is the distance between the starting point S of the groove 15a and the outer circumference of the flange portion 7a, within the range of 0 mm<L≤2 mm.

Note, however, that the distance L, or the distance between the starting point S of the groove 15a and the outer circumference of the flange portion 7a, is marked positive when the starting point S of the groove 15a is positioned inside of the flange portion 7a of the hollow metal cylinder 7 and is marked negative when the starting point S is placed outside of the flange portion 7a.

If the distance L between the starting point S of the groove 15a and the outer circumference of the flange portion 7a is less than 0 mm (or negative), the groove 15a of the stress relief member 15 has only a small effect and may result in accumulation of brazing material on the outer edge of the flange portion 7a. On the other hand, if the distance L between the starting point S of the groove 15a and the outer circumference of the flange portion 7a exceeds 2 mm, the joint area between the stress relief member 15 and flange portion 7a becomes so small that the stress relieving effect may disappear, resulting in problems such as exfoliation of the metal joint 5.

Preferably, the distance L, between the starting point S of the groove 15a and the outer circumference of the flange portion 7a, is kept within the range of 0.6 mm≤L≤1.3 mm.

It is also preferable to make the gradient angle β of the taper of the groove 15a within the range of 20° to 70° and the width T of the groove 15a to be 0.3 mm or larger. If the gradient angle β becomes less than 20°, an outward protrusion of the brazing material of the metal joint 5 may not flow into the tapered portion of the groove 15a, and a smoothly concaved meniscus P may not be formed between the bottom surface of the plate-shaped ceramic body 3 and the groove 15a of the stress relief member 15. On the other hand, if the gradient angle β exceeds 70°, a smoothly concaved meniscus P may not be formed due to the steepness of the taper surface, even though an outward protrusion of the brazing material of the metal joint 5 flows into the taper surface of the groove 15a. In case a smoothly concaved meniscus P is not formed, thermal stress due to heat cycle is not absorbed effectively and may case cracks to the stress relief member 15.

When the width T of the groove 15a is less than 0.3 mm, outward protrusion of the brazing material may not flow along the taper surface, which decreases the effect of preventing accumulations of the brazing material between the plate-shaped ceramic body 3 and the groove 15a. Incidentally, the width T of the groove 15a is the minimum distance from the starting point S of the groove 15a to an extension line drawn from the outer circumference of the stress relief member 15.

On the other hand, the thickness U of the flange portion 7a formed on the hollow metal cylinder 7 is thinner the better, in order to relieve stress caused by the differential thermal expansion with the plate-shaped ceramic body 3. The thickness U should preferably be 2.0 mm or less. However, the thickness U less than 0.05 mm may result in insufficient strength. Because of this, the thickness U of the flange portion 7a should preferably be kept within the range of 0.05 to 2.0 mm, and more preferably, within the range of 0.1 to 2.0 mm The plate-shaped ceramic body 3 of this embodiment is made of a ceramic material mainly comprising at least one of $Al_2O_3$, AlN, $ZrO_2$, SiC $Si_3N_4$ and such. Preferable examples, from the view point of resistances against corrosive gases and plasma, include, but not limited to, alumina containing more than 99% in mass of $Al_2O_3$ with sintering additives such as $SiO_2$, MgO and CaO; nitrides such as high purity aluminum nitride containing more than 99% in mass of AlN and a carbide such as silicon carbide.

A metal having a coefficient of thermal expansion, which is different from that of the plate-shaped ceramic body 3 by $2 \times 10^{-6}/°$ C. or less, should preferably be chosen for the material of the hollow metal cylinder 7. If the difference in coefficient of thermal expansion exceeds $2 \times 10^{-6}/°$ C., cracks tend to occur at the interface of the plate-shaped ceramic body 3 soon after the brazing. More specifically, examples include, but not limited to, tungsten, tungsten alloys, molybdenum, molybdenum alloys, nickel, nickel alloys, aluminum, aluminum alloys, titanium, titanium alloys and iron-nickel-cobalt alloys.

Furthermore, the material of the stress relief member 15 preferably is a metal or a ceramic, having a coefficient of thermal expansion which is different from that of the plate-shaped ceramic body 3 by less than $2 \times 10^{-6}/°$ C. to prevent exfoliation of the metal joint 5 from the plate-shaped ceramic body 3 and/or from the flange portion 7a of the hollow metal cylinder 7. More preferably a ceramic of the same kind of the plate-shaped ceramic body 3 is used for the stress relief member 15. Even more preferably, the same ceramic as the plate-shaped ceramic body 3 is used for the stress relief member 15.

Figure 6:
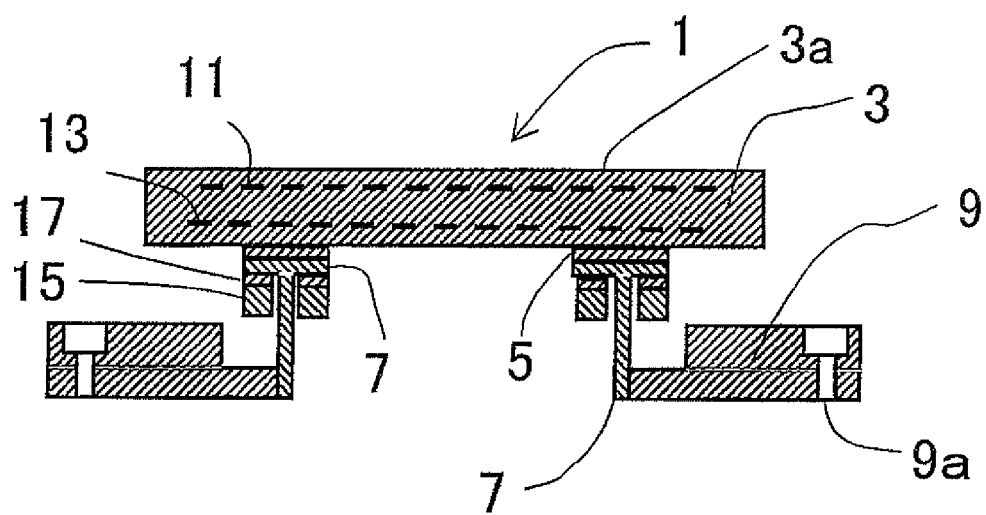
FIG. 6 is a cross sectional view showing a joined assembly according to the present invention.

It is also possible that the flange portion 7a of the hollow metal cylinder 7 is formed in T-shape as shown in FIG. 6. By making the flange portion 7a T-shaped, the hollow metal cylinder 7 can be more strongly joined. Especially in a large-sized wafer holder, having a plate-shaped ceramic body 3 larger than 300 mm in diameter, the outer diameter of the hollow metal cylinder 7 becomes 150 mm or larger. In such case, the flange portion 7a may be made into T-shaped, instead of L-shaped, so that more than one stress relief members 15 are placed both inside and outside of the hollow metal cylinder 7 to further prevent exfoliation and crack of the joint and the resulting gas leakage.

The material of the ring-shaped member 9 is preferably selected from the group consisting of tungsten, tungsten alloys, molybdenum, molybdenum alloys, nickel, nickel alloys, aluminum, aluminum alloys, titanium, titanium alloys and iron-nickel-cobalt alloys and combinations thereof. When the material is selected from the group, the ring-shaped member 9 can easily be welded to the hollow metal cylinder 7.

Figure 7:
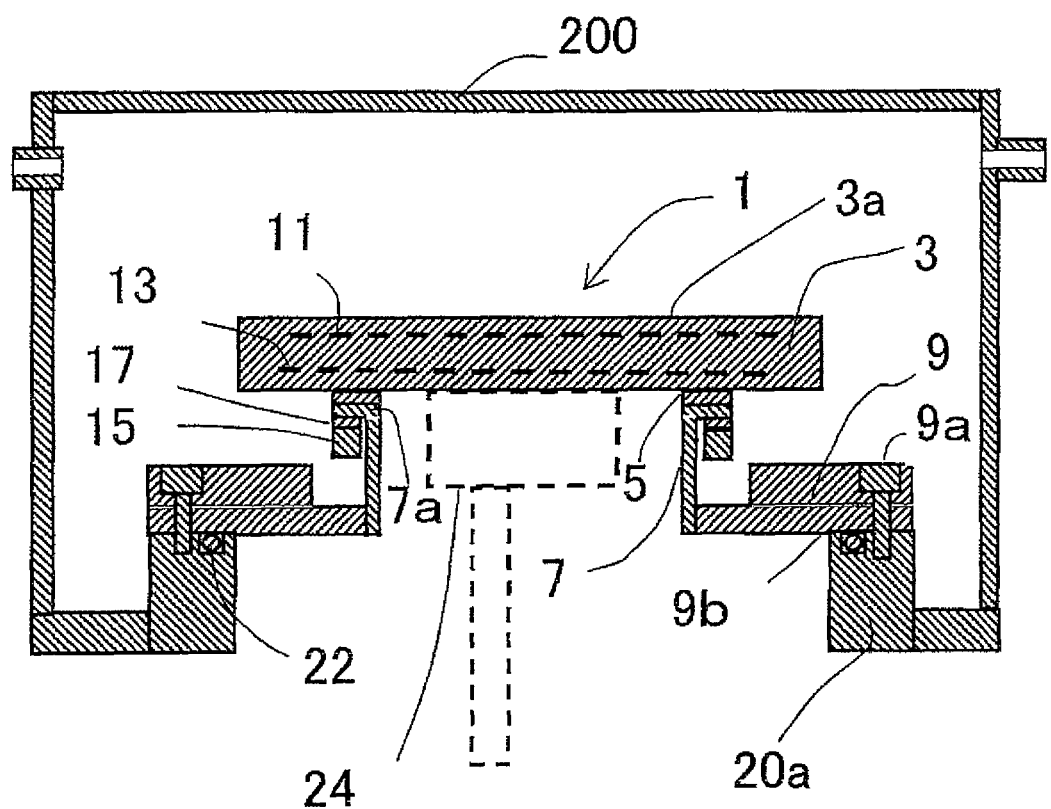
FIG. 7 is a cross sectional view showing a wafer holding assembly using a joined assembly according to the present invention.

In the wafer holding assembly thus arranged, the bottom surface 9b of the ring-shaped member 9 is supported by the base 20a of the vacuum chamber 200 of a thin film deposition apparatus, as shown in FIG. 7. The base 20a and the bottom surface 9b is joined mechanically with an O-ring placed between the bottom surface 9b of the ring-shaped member 9 and the base 20a supporting the ring-shaped member 9. Air tightness is further improved by inserting an O-ring 22 in a groove formed on at least one of the base 20a and bottom surface 9b. The arithmetic average surface roughness Ra of the bottom surface 9b, which comes in contact with the O-ring 22, is preferably within the range of 0.01 to 2 μm, to maintain high air tightness. Through holes 9a may be drilled through the ring-shaped member 9 so that the vacuum chamber is fixed more tightly to the ring-shaped member 9.

The following explains the method for making the wafer holding assembly of a semiconductor manufacturing apparatus, according to the embodiment.

Firstly, a metallized layer of a brazing material of Ag—Cu—Ti is formed at 800° C. at the joint surface 15b and the taper surface of the stress relief member 15 in advance, before brazing the plate-shaped ceramic body 3, the flange portion 7a of the hollow metal cylinder 7 and the stress relief member 15 made of a ceramic similar to the plate-shaped ceramic body 3. A layer of Ni-plating is formed on the metallized layer. At the same time, the flange portion 7a of the hollow metal cylinder 7 is also plated by Ni. Secondly, the plate-shaped ceramic body 3 and the flange portion 7a of the hollow metal cylinder 7 are joined together using a brazing material, consisting of BAg-8 composition of the Ag—Cu system, in a vacuum at 850° C., so that a brazing material layer 5 with thickness J of 50 μm is formed. The flange portion 7a joined to the stress relief member 15 is joined at the same time in the same manner and conditions, so that a brazing material layer 17 with thickness K of 50 μm is formed. Subsequently, a ring-shaped member 9, made of an iron-nickel-cobalt alloy, is welded to the other end of the hollow metal cylinder 7 to complete the wafer holding assembly shown in FIG. 6.

Preferably, a ring-shaped member 9 is joined to one end of the hollow metal cylinder 7, subsequently after the bottom surface of the plate-shaped ceramic body 3 is joined to the flange portion 7a via the metal joint 5. Using the method described above, the plate-shaped ceramic body 3 is attached to the ring-shaped member 9. When the assembly described above is used as a wafer holding assembly, the assembly is easily attached to, or separated from, the base 20a of the vacuum chamber 200.

Example 1

The wafer holding assemblies, shown in FIGS. 1, 2, 3, 4 and 6 respectively, were experimentally manufactured as samples of embodiments of the present invention. The assembly shown in FIG. 14 was also prepared as a comparative sample.

The plate-shaped ceramic bodies 3 are disks, with diameters of either 200 mm or 300 mm, and are made of an aluminum nitride ceramic containing 99.0% in mass of AlN. The plate-shaped ceramic bodies 3 were prepared in the following method. Slurry was prepared by mixing AlN powder with primary sintering additives and methanol, pulverizing the AlN powder to average diameter of 1 μm and by adding 10% of an organic binder. The granulated agglomerates were prepared by granulating the slurry using a spray drier. The granulated agglomerates was formed into a pre-form, with a molybdenum (Mo) heating element embedded, which was then hot pressed into a sintered plate. The hot press was carried out at 1,910° C., 20 MPa. The plate thus obtained was ground into a plate-shaped ceramic body 3. Characteristic evaluation of the aluminum nitride ceramic of the plate-shaped ceramic body 3 has proved its specific weight to be 3.25, a sufficient density close to the theoretical density, and its coefficient of thermal expansion to be $5 \times 10^{-6}$/° C.

On the other hand, a hollow metal cylinder 7 was also prepared from a Fe—Ni—Co alloy having a coefficient of thermal expansion of $7 \times 10^{6}$/° C. The outer diameter of the hollow metal cylinder 7 was 151.0 mm and the inner diameter was 150.0 mm.

The sample No. 1 was prepared in a form of a straight cylinder body with length of 30 mm. The sample No. 2 was prepared in a form, in which an opening of the hollow metal cylinder 7 has a U shaped cross section, with the outer diameter of the U-shape turnback portion of 161 mm.

The sample No. 3 has a corrugated hollow metal cylinder 7, in which ridge parts and depression parts are formed interchangeably around the cylinder. In the sample No. 3, the raised and depression parts were formed, so that their directions become perpendicular to the longitudinal direction of the cylinder, and the maximum diameter (diameter at the highest portion of the bellows) was 161 mm, while the minimum diameter (diameter at the lowest portion of the bellows) was 140 mm. The wave form of the corrugation was such that there were two ridge parts and two depression parts, as shown in the cross sectional diagram of FIG. 3.

The dimensions of the hollow metal cylinder 7 of the sample No. 4 (having the structure of FIG. 4) were 151.0 mm and 150.0 mm in the outer and inner diameters respectively of the cylinder, 166.0 mm, 151 mm and 0.5 mm in the outer and inner diameters and the thickness, respectively, of the flange portion 7a.

The dimensions of the hollow metal cylinder 7 of the sample No. 5 (having the structure of FIG. 6) were 251.0 mm and 250.0 mm in the outer and inner diameters respectively of the cylinder, 266.0 mm, 236 mm and 0.5 mm in the outer and inner diameters and the thickness, respectively, of the flange portion 7a.

Figure 14:
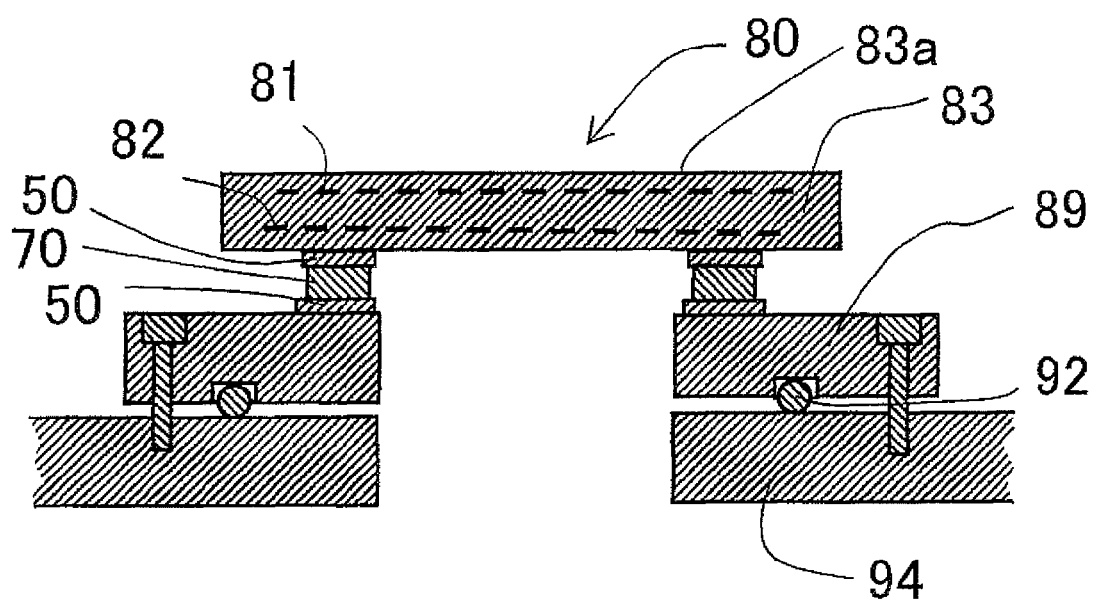
FIG. 14 is a cross sectional view of the joined assembly in a comparative example.

A comparative sample, or the sample No. 6, was also prepared as shown in FIG. 14. In the comparative sample No. 6, the hollow metal cylinder 7 is replaced by a circular ring 70, made of the same materials as the hollow metal cylinder 7 and having an outer diameter of 166 mm, inner diameter of 150 mm and thickness of 3 mm.

In the circular ring 70, the outer diameter (166 mm) and the inner diameter (150 mm) differ significantly (by 16 mm) compared to the axial length (thickness of 3 mm in the comparative example), making the ring rather flat.

On the other hand, taking an example of the sample No. 1, the outer diameter (151.0 mm) and the inner diameter (150.0 mm) differ by only 1 mm, while the axial length is 30 mm, making the shape to be more cylindrical or tubular.

In Example 1, a metallized layer of a blazing material of Ag—Cu—Ti was formed at 800° C. at the joint surface 15b and the taper surface of the stress relief member 15 in advance, before blazing the plate-shaped ceramic body 3, the flange portion 7a of the hollow metal cylinder 7 and the stress relief member 15 made of a ceramic similar to the plate-shaped ceramic body 3. A Ni plating layer is formed on the metallized layer.

At the same time, the flange portion 7a of the tubular metal cylinder 7 was also plated by Ni. Then, the plate-shaped ceramic body 3 and the flange portion 7a of the hollow metal cylinder 7 are joined together using a brazing material, consisting of an Ag—Cu system, in a vacuum at 850° C., so that a brazing material layer 5 with thickness J of 50 μm was formed. The flange portion 7a joined to the stress relief member 15 was joined at the same time in the same manner and conditions, so that a brazing material layer 17 with thickness K of 50 μm was formed.

Ring-shaped members 9 made of the same material as the hollow metal cylinder 7, having the inner diameter of 140 mm, thickness of 10 mm and outer diameter of 240 mm, were welded to the assemblies to complete the assembly samples No. 1 to 4 and 6.

Ring-shaped members 9 made of the same material as the hollow metal cylinder 7, having the inner diameter of 240 mm, thickness of 10 mm and outer diameter of 340 mm, were welded to the assemblies to complete the assembly sample No. 5.

Incidentally, the samples No. 1 to 4 are shown in FIG. 1 to 4 respectively, sample No. 5 in FIG. 6 and the sample No. 6 in FIG. 14.

Each joined assembly was installed on the vacuum chamber 200 of a CVD apparatus hermetically and was subjected to heat cycles between the ambient temperature and 500° C. at a temperature change rate of 40° C./min. The plate-shaped ceramic bodies 3 were then inspected for cracks, along with the leakage of the vacuum chamber using a helium leakage detector. The result is summarized in Table 1.

TABLE 1

| Sample No. | Number of heat cycles | Crack on the plate-shaped ceramic body | Gas leakage | Outer diameter of the plate-shaped ceramic body (mm) |
|---|---|---|---|---|
| 1 | 100 | Not observed | Not detected | 200 |
| 2 | 100 | Not observed | Not detected | 200 |
| 3 | 100 | Not observed | Not detected | 200 |
| 4 | 100 | Not observed | Not detected | 200 |
| 5 | 100 | Not observed | Not detected | 300 |
| * 6 | 12 | Observed | Detected | 200 |

The mark "*" indicates a comparative sample.

As shown in Table 1, the joined assemblies No. 1 to 5 according to the present invention exhibit desired performance without cracks on the plate-shaped ceramic body, nor on the joint surfaces, even after the heat cycles.

The wafer holding assemblies 1 of the samples No. 1 to 5 comprise a plate-shaped ceramic body 3, a hollow metal cylinder 7 and a ring-shaped member 9, wherein one end of the hollow metal cylinder 7 is joined to the bottom surface of the plate-shaped ceramic body 3 via a metal joint 5 and the other end of the hollow metal cylinder 7 is joined to the ring-shaped member 9.

It has been shown that the samples No. 1 to 5, in which the other end of the hollow metal cylinders 7 are joined to the inner circumferential surfaces of the ring-shaped members 9, exhibit excellent performance.

In particular, the sample No. 5 has been proved to have a superior resistance against heat cycles, despite the size of the plate-shaped ceramic body 1 with a diameter of 300 mm.

On the other hand, the comparative sample No. 6 shown in FIG. 14 started leakage at the twelfth heat cycle, showing inferior performance.

Example 2

Next, the samples No. 1 to 5 were renumbered to No. 21 to 25 respectively, and were exposed to the heat cycles of the same conditions as in Example 1. The number of heat cycle, until each sample exhibits gas leakage of $10^{-9}$ Pa·m$^3$/sec or more, was determined. The result is summarized in Table 2.

TABLE 2

| Sample No. | Number of heat cycles | Gas leakage (Pa · m$^3$/sec) | Outer diameter of the plate-shaped ceramic body (mm) |
|---|---|---|---|
| 21 | 205 | $10^{-7}$ | 200 |
| 22 | 312 | $10^{-8}$ | 200 |
| 23 | 437 | $10^{-8}$ | 200 |
| 24 | 539 | $10^{-8}$ | 200 |
| 25 | >700 | None | 300 |

The joined assembly of the sample No. 21 did not exhibited any crack in the plate-shaped ceramic body 3, nor in the joint, and the gas leakage was small at $10^{-7}$ Pa·m$^3$/sec, even after the heat cycles of 205 times. Incidentally, the sample No. 21 is an assembly, in which the plate-shaped ceramic body 3 is joined via the hollow metal cylinder 7.

The joined assembly of the sample No. 22 did not exhibit any crack in the plate-shaped ceramic body 3, nor in the joint, and the gas leakage was smaller at $10^{-8}$ Pa·m$^3$/sec, even after the heat cycles of 312 times. The sample thus exhibited even more preferable performance compared to the sample No. 21.

The sample No. 22 is an assembly having a U-shaped turnback portion in the vicinity of the joint between the hollow metal cylinder 7 and the ring-shaped member 9.

The sample No. 23, having a corrugated metal cylinder 7, exhibited a small gas leakage of $10^{-8}$ Pa·m$^3$/sec even after the heat cycle of 437 times, showing even more preferable performance compared to the sample No. 22.

The sample No. 24 exhibited a minute gas leakage of $10^{-8}$ Pa·m$^3$/sec even after the heat cycle of 539 times, showing excellent performance. In the sample No. 24, the flange portion 7a is joined to the stress relief member 15, having a coefficient of thermal expansion smaller than that of the plate-shaped ceramic body 3 by $2\times10^{-6}$/° C., via the joint member 17.

In the sample No. 25, there are provided a plate-shaped ceramic body 3 with a diameter of 300 mm, a T-shaped flange portion 7a and stress relief members 15 at both inner and outer circumference of the hollow metal cylinder 7, wherein the flange portion 7a is joined to the plate-shaped ceramic body 3 via the metal joint 5.

Example 3

In Example 3, the hollow metal cylinders 7 are made of an Fe—Ni—Co alloy having the coefficient of thermal expansion of $7\times10^{-6}$° C. and their dimensions are 265.5 mm and 265.0 mm for the outer and inner diameters respectively of the cylindrical portions, and 280.0 mm, 265.0 mm and 0.5 mm for the outer diameter, inner diameter and thickness respectively of the flange portions 13a.

In addition, the stress relief members of Example 3 are ring shaped, with their thickness W of 5 mm and width M of 6 mm, and made of the same aluminum nitride ceramic as the plate-shaped ceramic body 3. The outer edges of the joint surfaces 15b of the stress relief members 15 are made into tapered surfaces to form grooves 15a.

In Example 3, a metallized layer of a blazing material of Ag—Cu—Ti was formed at 800° C. at the joint surface 15b and the taper surface of the stress relief member 15 in advance, before blazing the plate-shaped ceramic body 3, the flange portion 7a of the hollow metal cylinder 7 and the stress relief member 15 made of a ceramic similar to the plate-shaped ceramic body 3. A Ni plating layer is formed on the metallized layer. At the same time, the flange portion 7a of the hollow metal cylinder 7 was also plated with Ni.

Then, the plate-shaped ceramic body 3 and the flange portion 7a of the hollow metal cylinder 7 are joined together using a brazing material, consisting of an Ag—Cu system, in a vacuum at 850° C., so that a brazing material layer 5 with thickness J of 50 μm was formed. The flange portion 7a joined to the stress relief member 15 was joined at the same time in the same manner and conditions, so that a brazing material layer 17 with thickness K of 50 μm was formed. A wafer holding assembly as shown in the FIG. 6 was thus prepared.

Twenty pieces of samples, each having different angle α between the meniscuses, formed from the bottom surfaces of the plate-shaped ceramic body 3 to the grooves 15a, and the plate-shaped ceramic body 3 were prepared. Each wafer holding assembly was installed in the vacuum chamber 200 of a CVD apparatus, exposed to heat cycles between ambient temperature and 500° C. at a temperature change rate of 40° C./min. The samples were then inspected for damages on the plate-shaped ceramic body 3. The results are shown in Table 3.

TABLE 3

| Sample No. | Meniscus angle | Number of samples exhibited He gas leakage | |
|---|---|---|---|
| | | after 700 cycles | after 1000 cycles |
| 31 | 60 | 2 | 3 |
| 32 | 40 | 0 | 1 |
| 33 | 28 | 0 | 0 |
| 34 | 22 | 0 | 0 |
| 35 | 10 | 0 | 0 |

As shown in the above table, the samples No. 31 to 35, in which angles α between the meniscus, formed from the bottom surface of the plate-shaped ceramic body 3 is 40° or less, exhibited an excellent performance with no damage on the plate-shaped ceramic body 3, even after the heat cycle of 700 times.

Especially, as shown in the cases of the samples No. 33 to 35, even better performance of no damage, after 1,000 times of heat cycle, is exhibited by making the angle α between the meniscus and plate-shaped ceramic body 3, to be 30° or less.

Example 4

In Example 4, samples were prepared in the same manner as the sample No. 5 was prepared in Example 1, except that the distances between the starting points S, of the grooves 15*a* of the stress relief members 15, and the outer circumferences of the flange portions 7*a* of the hollow metal cylinder 7 were varied. Heat cycle tests were carried out under the same conditions as Example 1 to determine the number of heat cycles until leakages of gas occur at the joint between the plate-shaped ceramic body 3 and the hollow metal cylinder 7, using a helium leakage detector.

Note, however, that the distance L, or the distance between the starting point S of the groove 15*a* and the outer circumference of the flange portion 7*a*, is marked positive when the starting point S of the groove 15*a* is positioned toward the inside of the flange portion 7*a* of the tubular metal cylinder 7 and is marked negative when the starting point S is positioned toward the outside of the flange portion 7*a*. Also note that, for all the assemblies, angles α between the meniscus P, formed from the bottom surface of the plate-shaped ceramic body 3 to the groove 15*a* of the stress relief member 15, and the plate-shaped ceramic body 3 was kept at 30° or less. The results are shown in Table 4.

TABLE 4

| Sample No. | Distance between the starting point S of the groove and the outer circumference of the flange portion (mm) | Number of samples exhibited He gas leakage | |
|---|---|---|---|
| | | after 700 cycles | after 1,000 cycles |
| 41 | 3 (starting point inside the flange) | 2 | 3 |
| 42 | 1.3 (starting point inside the flange) | 0 | 0 |
| 43 | 0.6 (starting point inside the flange) | 0 | 0 |
| 44 | 0.3 (starting point inside the flange) | 0 | 1 |
| 45 | 0 | 1 | 2 |
| 46 | −0.3 (starting point outside the flange) | 2 | 2 |
| 47 | −0.3 (starting point outside the flange) | 3 | 4 |

The results show that, in case of the samples No. 45 to 47, wherein the distances L, between the starting points S of the grooves 15*a* and the outer circumferences of the flange portions 7*a*, are 0 mm or less, more than one out of twenty samples exhibited leakage of He gas at 700 heat cycles. Here, the term "0 mm or less" indicates that the starting point S of the groove 15*a* is at the equal, or an outer position of the outer circumference of the flange portion 7*a* of the hollow metal cylinder 7. Especially, in case of the samples wherein the distances L, between the starting points S of the grooves 15*a* and the outer circumferences of the flange portions 7*a*, are −0.6 mm, three out of twenty samples exhibited leakage of He gas at 700 heat cycles.

And also, in case of the samples, wherein the distances L, between the starting points S of the grooves 15*a* and the outer circumferences of the flange portions 7*a*, are more than 2.0 mm, two out of twenty samples exhibited leakage of He gas at 700 heat cycles.

On the other hand, the samples No. 42 to 44, wherein the distances L, between the starting points S of the grooves 15*a* and the outer circumferences of the flange portions 7*a*, are within the range of 0 mm<L≤2 mm, no leakage of He gas was detected even after 700 heat cycles with high durabilities. Particularly, as in the cases of sample No. 42 and 43, wherein the distances A, between the starting points S of the grooves 15*a* and the outer circumferences of the flange portions 7*a*, are within 0.6 mm≤L≤1.3 mm, no leakage of He gas was detected even after 1,000 heat cycles with excellent durabilities.

As described above, if the distance L, between the starting point S of the groove 15*a* and the outer circumference of the flange portion 7*a*, is in the range of 0 mm<L≤2 mm, a sufficient air-tightness and high durability are obtained at the joint between the plate-shaped ceramic body 3 and hollow metal cylinder 7.

Example 5

Next another experiment was carried out in the same manner as Example 1. Stress relief members 15 were prepared, in which the thickness W was 5 mm, the distance L, between the starting points S of the grooves 15*a* and the outer circumferences of the flange portions 7*a*, was 0.6 mm. The brazing layers of 5 and 17 were set to 50 μm respectively, wherein brazing materials of Au—Ni alloys having different Au contents were used in order to vary yield strengths of the brazing layers. The results are shown in Table 5.

TABLE 5

| Sample No. | Brazing material yield strength (MPa) | Number of samples exhibited He gas leakage | |
|---|---|---|---|
| | | after 700 cycles | after 1000 cycles |
| 51 | 410 | 0 | 0 |
| 52 | 199 | 0 | 0 |
| 53 | 145 | 0 | 0 |

As shown in the table, the samples No. 51 to 53, having brazing layers 5 and 17 with yield strengths in the range of 145 to 450 MPa, did not show any cracks after 700 heat cycles, or any leakage detected by the helium leakage detector after 1,000 heat cycles.

Example 6

Plate-shaped ceramic bodies 3 were prepared in the same method as in Example 1, except different materials were used for the hollow metal cylinders 7 and the ring-shaped members 9. Then, stress relief members 15 were prepared, in which the thickness W was 5 mm, the distance L, between the starting points S of the grooves 15a and the outer circumferences of the flange portions 7a, was 0.6 mm, the brazing layers of 5 and 17 were set to 50 μm respectively, in the same manner as the sample No. 4 of Example 4 was prepared. The same evaluation was carried out as in Example 1. The results are summarized in Table 6.

TABLE 6

| Sample No. | Material for the plate-shaped ceramic body | Material for the hollow metal cylinder | Material for the ring-shaped member | Gas leakage after 1000 heat cycles |
|---|---|---|---|---|
| 61 | AlN | W | W | 0 |
| 62 | AlN | W—Co alloy | W—Co alloy | 0 |
| 63 | AlN | Mo | Mo | 0 |
| 64 | AlN | Mo—Co alloy | Mo—Co alloy | 0 |
| 65 | AlN | Fe—Ni—Co alloy | Fe—Ni—Co alloy | 0 |
| 66 | AlN | Ni | Ni | 0 |
| 67 | AlN | Ni alloy | Ni alloy | 0 |
| 68 | AlN | Al | Al | 0 |
| 69 | AlN | Al alloy | Al alloy | 0 |
| 70 | AlN | Ti | Ti | 0 |
| 71 | AlN | Ti alloy | Ti alloy | 0 |
| 72 | AlN | Fe—Ni—Co alloy | AlN | 0 |
| 73 | AlN | Fe—Ni—Co alloy | SiC | 0 |
| 74 | SiC | Fe—Ni—Co alloy | Al alloy | 0 |

The samples No. 61 to 74, wherein the plate-shaped ceramic body 3 is made of a material selected from the group consisting of nitrides, carbides, alumina; and the hollow metal cylinder 7 is made of a material selected from the group consisting of tungsten, tungsten alloys, molybdenum, molybdenum alloys, nickel, nickel alloys, aluminum, aluminum alloys, titanium, titanium alloys and iron-nickel-cobalt alloys, did not show any gas leakage even after 1,000 heat cycles and exhibited excellent performance.

The samples No. 61 to 74, wherein the ring-shaped member 9 is made of a material selected from the group consisting of tungsten, tungsten alloys, molybdenum, molybdenum alloys, nickel, nickel alloys, aluminum, aluminum alloys, titanium, titanium alloys and iron-nickel-cobalt alloys, did not show any gas leakage even after 1,000 heat cycles and exhibited excellent performance.

Example 7

Figure 8A:
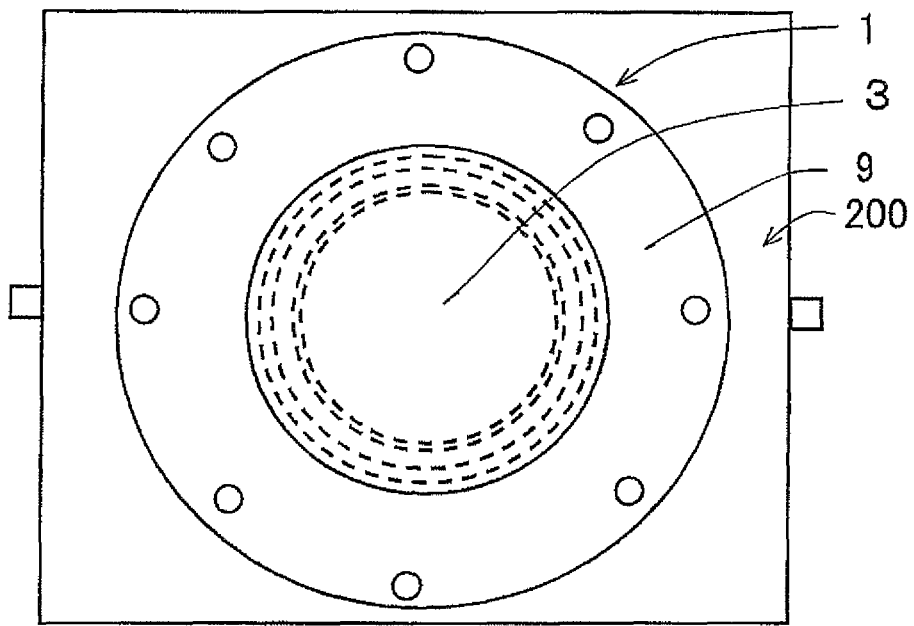
FIG. 8A is a plane view showing the assembly sample No. 81 of Example 7, according to an embodiment of the present invention, and the attaching structure of the assembly.
Figure 8B:
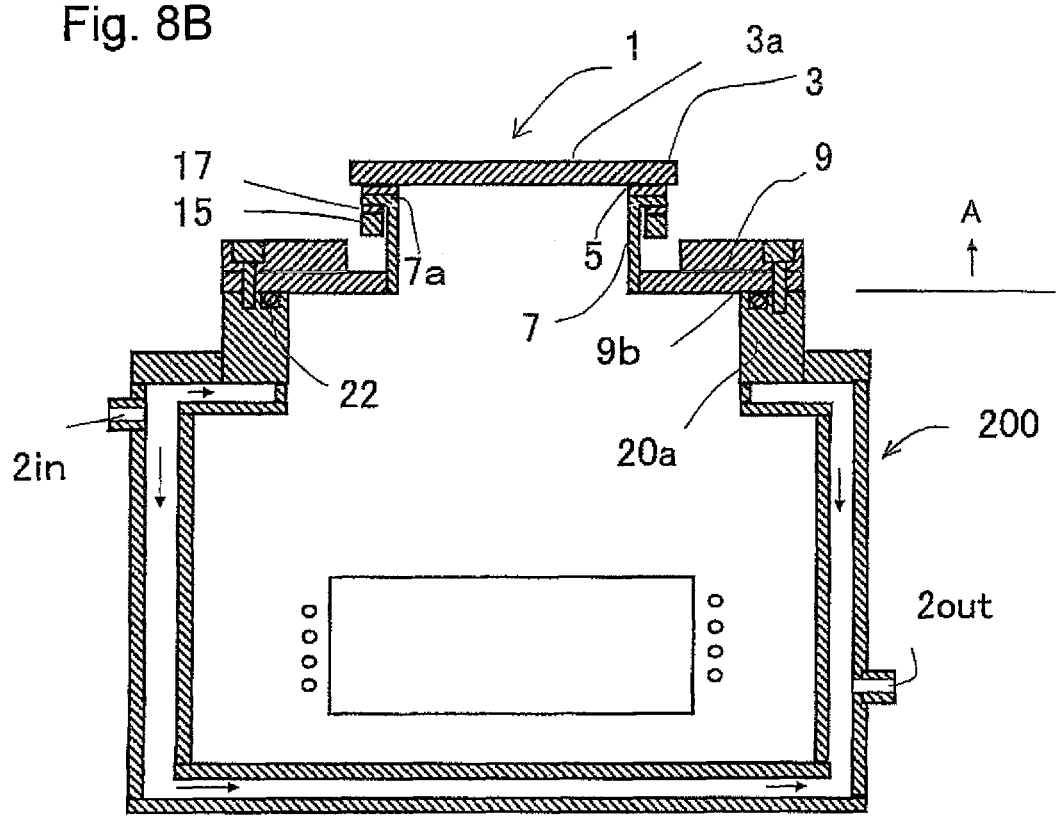
FIG. 8B is a cross-sectional view showing the assembly sample No. 81 of Example 7, according to an embodiment of the present invention, and the attaching structure of the assembly.

In Example 7, a joined assembly, according to the present invention, is applied to an observation window of a vacuum chamber, as shown in FIG. 8A and FIG. 8B. The vacuum chamber is applied, for example, to a semiconductor processing apparatus.

In this example, a slurry was first prepared by wet mixing $Al_2O_3$ powder, having 99.99% purity and average particle size of 0.8 μm with 0.05 mass % of magnesium oxide and an organic binder, in a ball-mill using high purity $Al_2O_3$ balls. The slurry was then granulated, formed into a disk plate under 150 MPa and heated at 500 DC for 2 hours to remove the binder.

Subsequently, the pre-form was sintered in hydrogen atmosphere at 1,800 DC for 2 hours. The sintered body was ground on the top, bottom and circumferential surfaces into a plate-shaped ceramic body 3. The top and bottom surfaces of the plate-shaped ceramic body 3 was lapped with diamond powder, and then polished with diamond powder having 0.2 μm average diameter, to obtain a transparent alumina substrate of 180 mm in diameter, used for a high light transmission window.

On the circumference of the main surface the alumina substrate a metallization layer mainly consisting of a Al—Cu alloy with minute addition of Ti. The joined assembly 1 of the sample No. 81, having a circular hollow in the hollow metal cylinder 7 as shown in FIG. 8A and FIG. 5B, was thus prepared. Incidentally, the flange portion of the hollow metal cylinder 7 of the sample No. 81 was brazed to the metallization layer of the alumina substrate. A ring-shaped alumina member was also brazed to the flange portion. A hollow cylinder was joined to the other end of the hollow metal cylinder. The joint, between the ring-shaped member 9 and the hollow metal cylinder 7, has the same cross-section as the hollow metal cylinder 7.

Figure 9A:
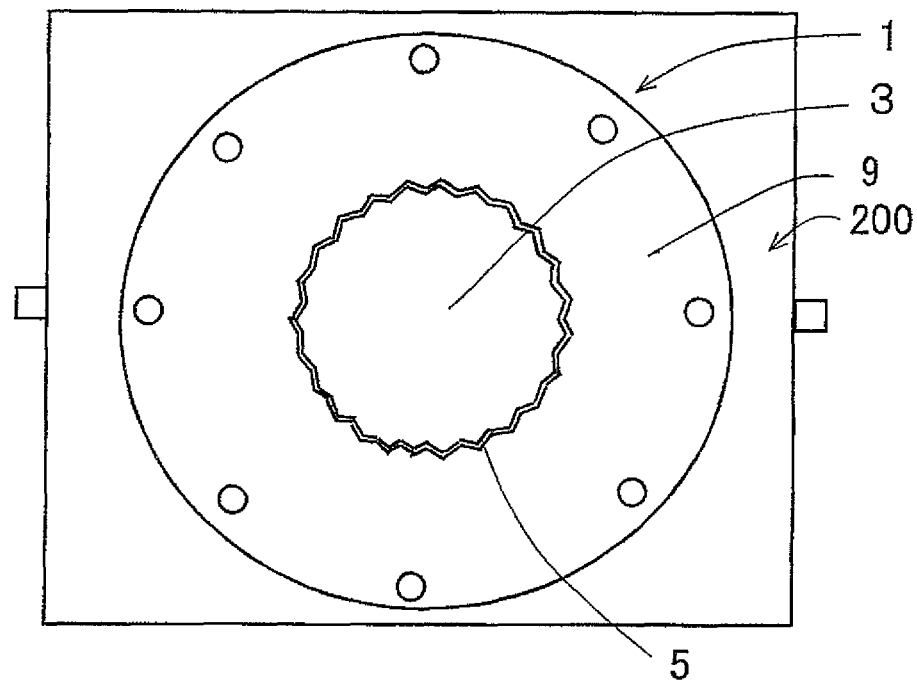
FIG. 9A is a plane view showing the assembly sample No. 82 of Example 7, according to an embodiment of the present invention, and the attaching structure of the assembly.

In addition, there was also prepared a sample No. 82, wherein the cross section of the cylindrical portion of the hollow metal cylinder 7 is waved at a pitch of about 2 mm, as in the joined assembly 1 shown in FIG. 9. In other words, in the sample 82, the hollow metal cylinder 7 as an outer circumference with ridge parts and depression parts placed interchangeably, wherein the raised and depression parts are in parallel with the axis of the cylinder.

Figure 10A:
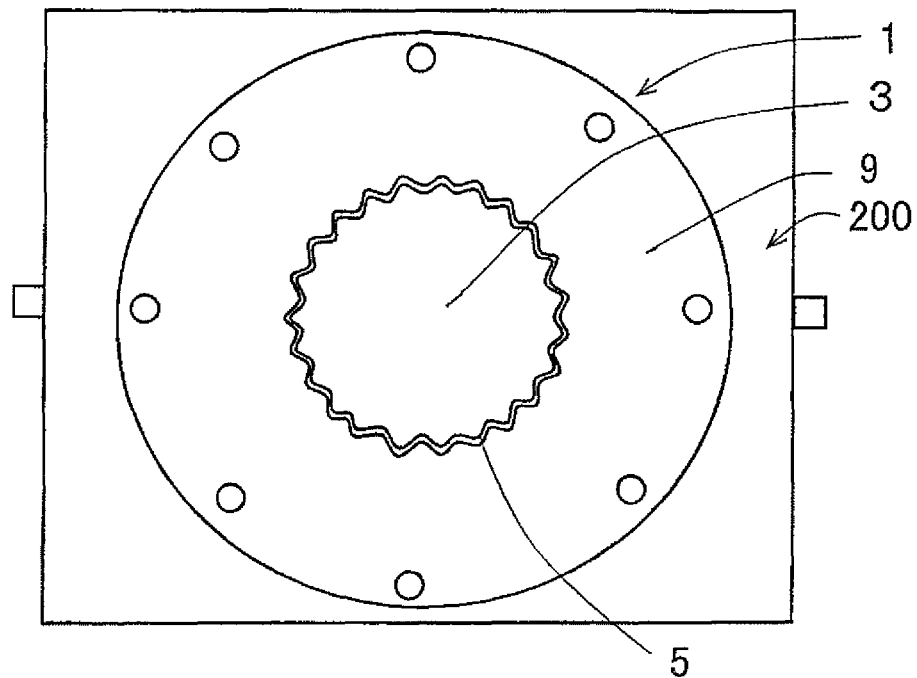
FIG. 10A is a plane view showing the assembly sample No. 83 of Example 7, according to an embodiment of the present invention, and the attaching structure of the assembly.

In Example 7, there was prepared, in addition, a sample No. 83 wherein the cross section of the cylindrical portion is formed in a sine curve, as in the joined assembly 1 shown in FIG. 10. The sine curved cylinder, described above, is made from a corrugated sheet rounded into a cylindrical shape and, in case of the sample No. 83, the pitch of the sine curve of the corrugated sheet was 2 mm and the amplitude was 1 mm.

Figure 9B:
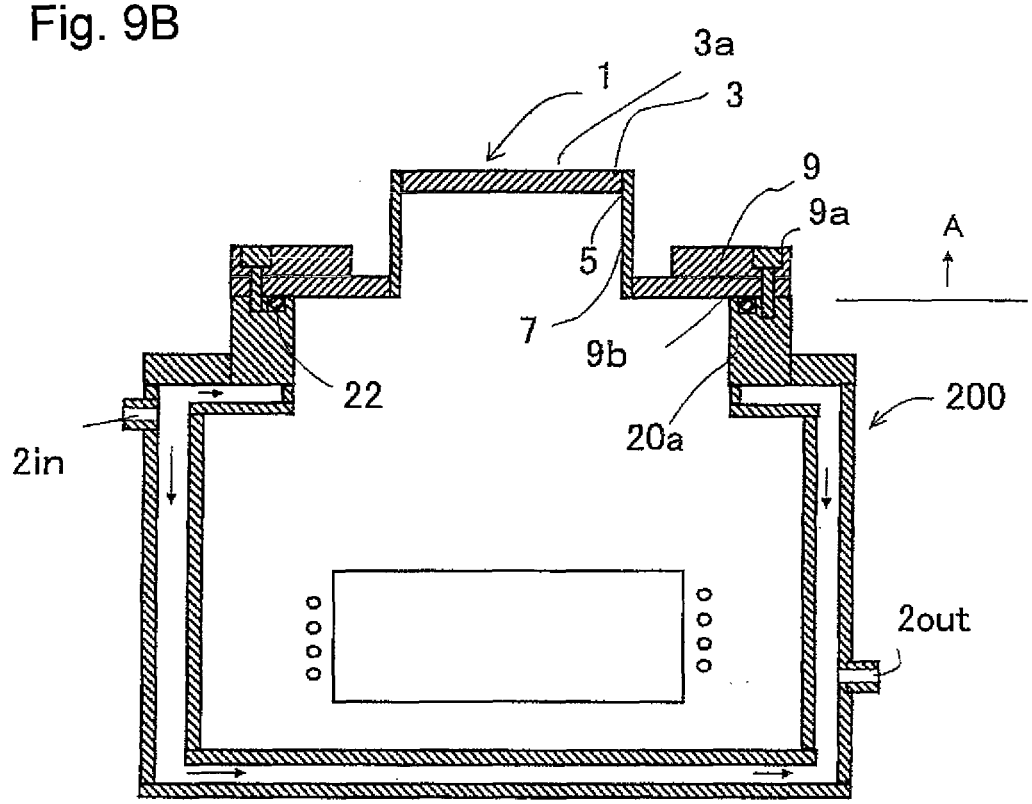
FIG. 9B is a cross-sectional view showing the assembly sample No. 82 of Example 7, according to an embodiment of the present invention, and the attaching structure of the assembly.
Figure 10B:
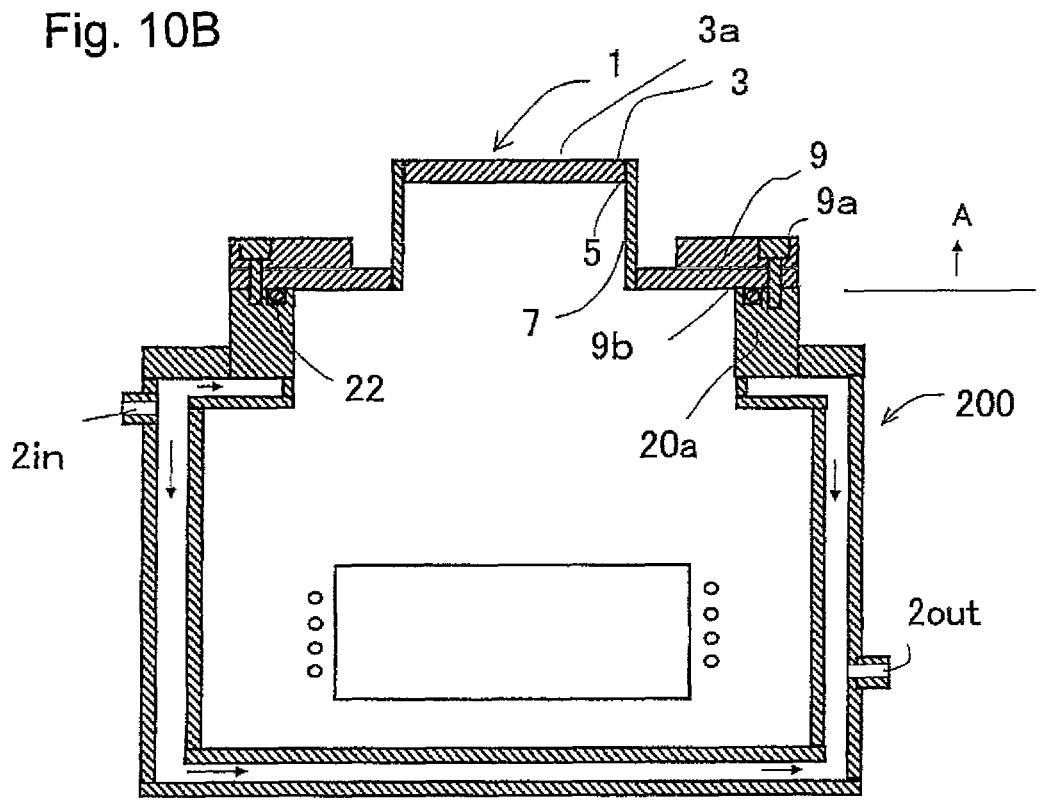
FIG. 10B is a cross-sectional view showing the assembly sample No. 82 of Example 7, according to an embodiment of the present invention, and the attaching structure of the assembly.
Figure 11:
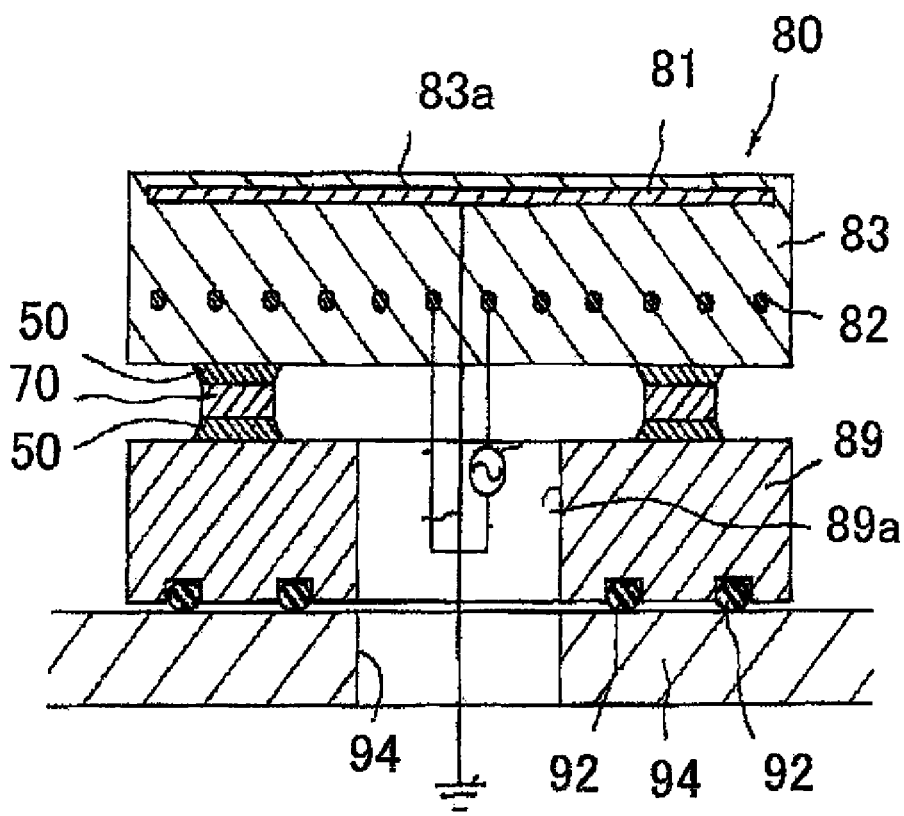
FIG. 11 is a cross sectional view showing a conventional joined assembly.
Figure 12:
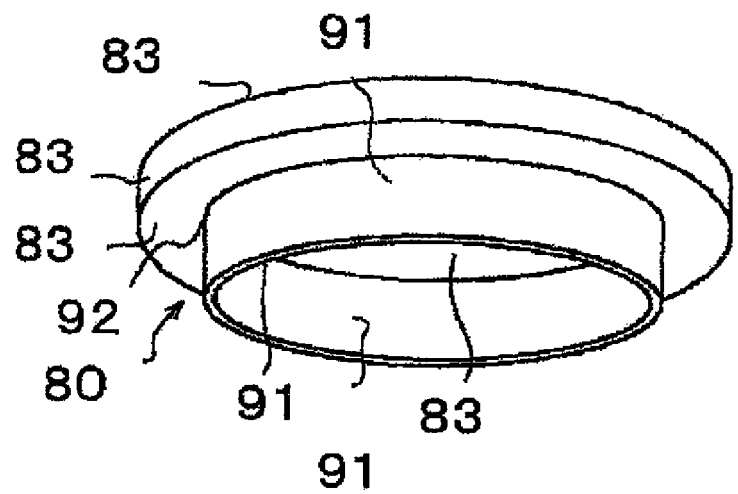
FIG. 12 is a perspective view of a conventional joined assembly.
Figure 13:
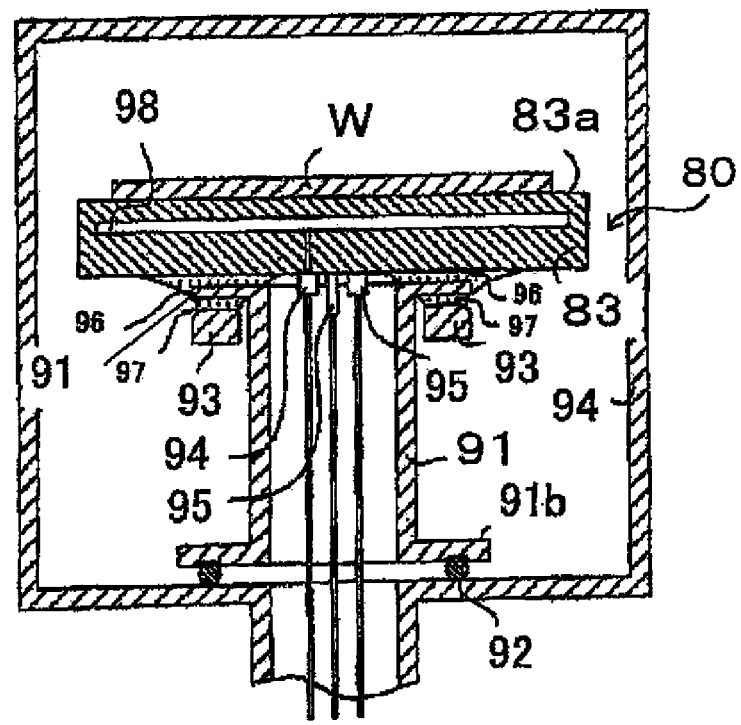
FIG. 13 is a cross sectional view of a wafer holding assembly of a conventional joined assembly.

The joined assemblies 1 of the samples No. 81 to 83, thus prepared, were installed in a vacuum chamber 200 as shown in FIGS. 8B, 9B and 10B. A infrared heater was installed inside the vacuum chamber 200, of which interior walls were cooled. The heater was energized to raise the temperature of a black sheet, placed at 3 mm distance outside the observation window, to reach 500° C. at a rate of 100° C./min. After the temperature of 500° C. was reached, the temperature was held for 3 min, and then cooled down to 25° C. The heating/cooling cycle was repeated.

The results are shown in Table 7.

Incidentally, the cooling water, for cooling the interior walls of the vacuum chamber 200, was fed into the fill port 2 in and was drained from the port 2 out.

TABLE 7

| Sample No. | Material for the plate-shaped ceramic body | Material for the hollow metal cylinder | Cross sectional shape of the hollow metal cylinder | Material for the ring-shaped member | Heat cycles at which a leakage of $10^{-9}$ Pa · m$^3$/sec or more was detected |
|---|---|---|---|---|---|
| 81 | $Al_2O_3$ | Ti | tubular | Ti alloy | 875 |
| 82 | $Al_2O_3$ | Ti | Zigzag | Ti alloy | 1106 |
| 83 | $Al_2O_3$ | Ti | Sine curve | Ti alloy | ≥1500 |

The sample No. 81 to 83 kept sufficient air tightness without any gas leakage through the joined assembly, after 500 times of the heating/cooling cycles.

The sample No. 81, wherein the hollow metal cylinder 7 has a tubular cross section, kept air tightness up to 875 heat cycles. The sample No. 82, wherein the hollow metal cylinder 7 has a zigzag shaped cross section, kept air tightness up to 1,106 heat cycles. The sample No. 83, wherein the hollow metal cylinder 7 has a sine curved cross section, remained intact without loss of air tightness even over 1,500 heat cycles.

The experiments of Examples were carried out based on the embodiments shown in FIGS. 8, 9 and 10. As in the cases of FIGS. 9 and 10, wherein the cross section of the hollow metal cylinder 7 is zigzag, or sine curved, the differential thermal expansion between the plate-shaped ceramic body 3 and the hollow metal cylinder 7 is absorbed more effectively. The effect of absorbing the differential thermal expansion has been proved to prevent the exfoliation of the joint 5 and damage to the plate-shaped ceramic body 3.

In the embodiments described above, alumina was used for the exemplary plate-shaped ceramic body 3, however, it should be obvious that the same effect is obtained in case the plate-shaped ceramic body 3 is made of aluminum nitride.

The invention claimed is:

1. A wafer holding assembly comprising a joined assembly comprising:
   a plate-shaped ceramic body;
   a ring-shaped member; and
   a hollow metal body comprising a body portion and a flange,
   wherein the flange is not parallel to the body portion,
   wherein a first surface of the flange is joined to the bottom surface of the plate-shaped ceramic body and the body portion
   wherein a second surface of the flange is joined to a stress relief member, the stress relief member having an outer circumference and a tapered groove on the outer circumference; and
   wherein a differential in thermal expansion between the stress relief member and the plate-shaped ceramic body is $2\times10^{-6}1°$ C. or less.

2. The wafer holding assembly according to claim 1; wherein the plate-shaped ceramic bod comprises a material selected from the group consisting of metal nitrides, metal carbides and alumina, as a main component and wherein the hollow metal body comprises a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

3. The wafer holding assembly according to claim 2; wherein the ring-shaped member comprises a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

4. The wafer holding assembly according to claim 2, wherein a top surface of the plate-shaped ceramic body is a wafer mounting surface, and the plate-shaped ceramic body comprises an electrode for electrostatic chucking and/or a resistance heating element.

5. An attaching structure of the wafer holding assembly according to claim 4, wherein the bottom surface of the ring-shaped member is fixed to another member through at least one O-ring.

6. The wafer holding assembly according to claim 1, wherein a top surface of the plate-shaped ceramic body is a wafer mounting surface, and the plate-shaped ceramic body comprises an electrode for electrostatic chucking and/or a resistance heating element.

7. An attaching structure of the wafer holding assembly according to claim 6, wherein the bottom surface of the ring-shaped member is fixed to another member through at least one O-ring.

8. An attaching structure according to claim 7,
   wherein the ring-shaped member has through-holes and the ring-shaped member is fixed to the another member with bolts inserted through the through-holes.

9. A method for processing wafers comprising:
   a process of mounting a wafer on the wafer holding assembly according to claim 6,
   at least one process of depositing a semiconductor thin film, etching and forming a resist film while chucking using the chucking electrode and/or heating the wafer using the resistance heating element.

10. The wafer holding assembly according to claim 1, wherein, in a cross-section of the hollow metal body, the body portion and the flange are L-shaped.

11. The wafer holding assembly according to claim 1, wherein the flange is perpendicular to the body portion.

12. The wafer holding assembly according to claim 1, wherein the first surface of the flange is connected to the plate-shaped ceramic body via a first brazing layer, and the second surface of the flange is connected to the stress relief member via a second brazing layer.

13. A wafer holding assembly comprising a joined assembly comprising:
   a plate-shaped ceramic body;
   a ring-shaped member; and
   a hollow metal body comprising a body portion and a flange,
   wherein the flange is not parallel to the body portion
   wherein a first surface of the flange is joined to the bottom surface of the plate-shaped ceramic body,
   wherein the body portion is joined to an inner circular surface of the ring-shaped member; and
   wherein a second surface of the flange is joined to a stress relief member, and a differential in thermal expansion between the stress relief member and the plate-shaped ceramic body is $2\times10^{-6}1°$ C. or less,
   wherein the stress relief member has an outer circumference and a tapered groove on the outer circumference.

14. The wafer holding assembly according to claim 13; wherein the plate-shaped ceramic body comprises a material selected from the group consisting of metal nitrides, metal carbides and alumina, as a main component and wherein the hollow metal body comprises a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

15. The wafer holding assembly according to claim 14; wherein the ring-shaped member comprises a material selected from the group consisting of tungsten, tungsten alloys, molybdenum, molybdenum alloys, nickel, nickel alloys, aluminum, aluminum alloys, titanium, titanium alloys and iron-nickel-cobalt alloys.

16. The wafer holding assembly according to claim 13, wherein a top surface of the plate-shaped ceramic body is a wafer mounting surface, and the plate-shaped ceramic body comprises an electrode for electrostatic chucking and/or a resistance heating element.

17. The wafer holding assembly according to claim 13, wherein, in a cross-section of the hollow metal body, the body portion and the flange are L-shaped.

18. The wafer holding assembly according to claim 13, wherein the flange is perpendicular to the body portion.

19. The wafer holding assembly according to claim 13, wherein the first surface of the flange is connected to the plate-shaped ceramic body via a first brazing layer, and the second surface of the flange is connected to the stress relief member via a second brazing layer.

* * * * *